United States Patent
Kim et al.

(10) Patent No.: US 7,553,761 B2
(45) Date of Patent: Jun. 30, 2009

(54) METHOD OF FABRICATING SEMICONDUCTOR DEVICE

(75) Inventors: Il-Goo Kim, Yongin-si (KR); Ju-Hyuck Chung, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 452 days.

(21) Appl. No.: 11/325,087

(22) Filed: Jan. 4, 2006

(65) Prior Publication Data

US 2006/0148264 A1     Jul. 6, 2006

(30) Foreign Application Priority Data

Jan. 5, 2005     (KR) .................. 10-2005-0000997

(51) Int. Cl.
H01L 21/4763 (2006.01)
(52) U.S. Cl. ................ 438/638; 438/706; 257/E21.579
(58) Field of Classification Search ................ 438/618, 438/634, 638, 643, 700, 708, 709, 717, 637, 438/639, 706; 257/E21.575, E21.577, E21.579, 257/E21.585
See application file for complete search history.

(56) References Cited

U.S. PATENT DOCUMENTS 7,122,479 B2 * 10/2006 Ohmoto et al. ............. 438/714
7,279,428 B2 * 10/2007 Lin et al. .................... 438/710
2004/0074869 A1   4/2004 Wang et al.

FOREIGN PATENT DOCUMENTS

| JP | 2004-022974 | 1/2004 |
| KR | 10-2001-0081453 A | 8/2001 |
| KR | 10-2002-0009440 | 2/2002 |
| KR | 10-2003-0087041 | 11/2003 |

* cited by examiner

Primary Examiner—Brook Kebede
(74) Attorney, Agent, or Firm—F. Chau & Associates, LLC

(57) ABSTRACT

A method of fabricating a semiconductor device is provided. The method includes forming a low-k dielectric layer on a semiconductor substrate, forming a mask pattern on the low-k dielectric layer, and dry etching the low-k dielectric layer using the mask pattern as an etch mask. A dry etching gas is used for the dry etching of the low-k dielectric layer. The dry etching gas includes a mixture of a gas containing chlorine atoms and at least one gas selected from a group consisting of a gas containing oxygen atoms, a gas containing nitrogen atoms, and an inert gas. The dry etching gas does not contain fluorine atoms.

23 Claims, 15 Drawing Sheets

METHOD OF FABRICATING SEMICONDUCTOR DEVICE

CROSS-REFERENCE TO RELATED APPLICATION

This application claims the benefit of Korean Patent Application No. 10-2005-0000997, filed Jan. 5, 2005, the disclosure of which is hereby incorporated by reference herein in its entirety.

BACKGROUND OF THE INVENTION

1. Field of the Invention

The present invention relates to a method of fabricating a semiconductor device, and more particularly, to a method of fabricating a semiconductor device having a low-k dielectric layer.

2. Description of the Related Art

As the integration density of semiconductor devices has increased, techniques employing multi-layered metal interconnections for forming these devices have also become more widely used. In particular, the multi-layered metal interconnections should be formed of metal layers which have low resistivity and high reliability for enhancing the performance of the semiconductor device. Moreover, an insulating layer located between the multi-layered metal interconnection should be formed of a low-k dielectric layer. For example, a copper (Cu) layer is widely used as the metal layer. However, it is difficult to pattern a Cu layer using typical photolithography and etching processes. Accordingly, a damascene process is widely used to pattern the metal layer, e.g. a Cu layer.

An insulating layer with a dielectric constant of less than 2.5 is used for the low-k dielectric layer. Examples of the above described insulating layer include silicon oxycarbide (SiOC) layer, a carbon-doped silicon oxide (SiOCH) layer, or a silicon oxyfluoride (SiOF) layer. The low-k dielectric layer should also have a porous sponge structure, so that absorption is apt to occur.

FIGS. 1A to 1G are cross-sectional views illustrating a conventional method of fabricating a semiconductor device having a low-k dielectric layer.

Referring to FIG. 1A, a lower insulating layer 10 is formed on a semiconductor substrate 5. A lower interconnection 12 is then formed within the lower insulating layer 10 using a typical damascene technique. The lower interconnection 12 may be formed of a copper layer or a tungsten layer.

Next, in the above conventional method, an etch stop layer 15 and a low-k dielectric layer 17 are sequentially formed on the semiconductor substrate 5 having the lower interconnection 12. The etch stop layer 15 is formed of a silicon nitride layer. The low-k dielectric layer 17 is formed of a single low-k dielectric layer for enhancing the operating speed of the semiconductor device and also to prevent an interface from being formed within the low-k dielectric layer 17. The single low-k dielectric layer may be formed of a silicon oxide layer containing carbon (C), fluorine (F), or hydrogen (H). For example, a silicon oxycarbide (SiOC) layer, a carbon-doped silicon oxide (SiOCH) layer, or a silicon oxyfluoride (SiOF) layer are all materials which may be used in forming the low-k dielectric layer 17. In addition, the low-k dielectric layer 17 has a porous sponge structure and may be degraded due to damage in subsequent processes. Accordingly, a capping layer 20 for protecting the characteristics of the low-k dielectric layer 17 is formed on the low-k dielectric layer 17. The capping layer 20 may be formed of a tetra ethyl ortho silicate (TEOS) layer or an undoped silicate glass (USG) layer. A mask layer is formed on the capping layer 20 and patterned to form a mask pattern 23. The mask pattern 23 may be formed of a photoresist layer or a hard mask layer.

Referring to FIG. 1B, the capping layer 20 and the low-k dielectric layer 17 are sequentially dry etched using the mask pattern 23 as an etch mask, thereby forming a preliminary via hole 25 which exposes the etch stop layer 15 above the lower interconnection 12. At the time of the dry etching, a gas containing fluorine atoms, for example, $C_xF_y$ or $CH_xF_y$ is used as the etch gas. Moreover, as mentioned, the low-k dielectric layer 17 has a porous sponge structure, so that fluorine atoms (F) are absorbed into the low-k dielectric layer 17 when the low-k dielectric layer 17 is dry etched using the gas containing the fluorine atoms.

Referring to FIG. 1C, a sacrificial layer 30 is formed which buries the preliminary via hole 25 on the semiconductor substrate having the preliminary via hole 25. A photoresist pattern 32 is then formed on the sacrificial layer 30. The sacrificial layer 30 is formed of a layer having a wet etch selectivity with respect to the low-k dielectric layer 17. The sacrificial layer 30 is formed to prevent deformation of the profile of the preliminary via hole 25 in subsequent processes. The sacrificial layer 30 may be formed of a hydro-silsesquioxane (HSQ) layer or organic siloxane. Moreover, hydrogen or moisture ($H_2O$) is absorbed into the low-k dielectric layer 17 while the sacrificial layer 30 is being formed. The above absorption of hydrogen or moisture causes the formation of hydrofluoric acid (HF) in the low-k dielectric layer 17, due to a reaction between the hydrogen or moisture with the fluorine atoms (F) which were already absorbed into the low-k dielectric layer 17 at the time of the dry etching. Consequently, the silicon oxide layer based low-k dielectric layer 17 is internally dissolved by the above generated fluoric acid (HF), thereby causing voids (A) to form in the low-k dielectric layer 17.

Referring to FIG. 1D, the sacrificial layer 30, the mask pattern 23, the capping layer 20, and the low-k dielectric layer 17 are then sequentially dry etched using the photoresist pattern 32 as an etch mask, thereby forming a trench region 35 which crosses over the preliminary via hole 25 and which is positioned within the low-k dielectric layer 17. In this case, a sacrificial layer 30a remains within the preliminary via hole 25. A gas containing fluorine atoms, for example, $C_xF_y$ or $CH_xF_y$, is used as the etch gas at the time of the dry etching. Accordingly, as described with reference to FIG. 1B, the low-k dielectric layer 17 has a porous sponge structure, so that the fluorine atoms (F) are absorbed into the low-k dielectric layer 17 through a sidewall of the trench region 35 when it is dry etched using the gas containing the fluorine atoms.

Referring to FIG. 1E, the sacrificial layer 30a within the preliminary via hole 25 and the sacrificial layer 30 above the low-k dielectric layer 17 are removed, thereby exposing the etch stop layer 15 on the bottom surface of the preliminary via hole 25. The sacrificial layers 30 and 30a are removed using a wet solution. Moreover, the sacrificial layer 30a has a wet etch selectivity with respect to the low-k dielectric layer 17, so that a surface of the low-k dielectric layer 17 is prevented from being damaged due to etching.

The etch stop layer 15 exposed on the bottom surface of the preliminary via hole 25 is then removed to form a final via hole 25a which exposes the lower interconnection 12. The etch stop layer 15 is removed using a dry etching process. A portion of the mask pattern 23 may be etched while the etch stop layer 15 is etched. Hydrogen or moisture ($H_2O$) is absorbed into the low-k dielectric layer 17 to react with the fluorine atoms (F) which have already been absorbed at the time of the dry etching process, so that fluoric acid (HF) is also formed as described with reference to FIG. 1C in the process of removing the sacrificial layers 30 and 30a and the process of forming the final via hole 25a. Accordingly, the low-k dielectric layer 17 is internally dissolved by the above generated fluoric acid (HF), so that voids A occur within the low-k dielectric layer. In addition, in the event that voids have already been formed in the low-k dielectric layer 17, the above dissolving reaction may proceed to cause further enlargement of these voids A1 to occur.

Referring to FIG. 1F, an upper metal layer is formed on the semiconductor substrate having the final via hole 25a. The upper metal layer may be formed by sequentially stacking a barrier metal layer 40 and a metal layer 45. The barrier metal layer 40 may be formed of tantalum nitride (TaN) or titanium nitride (TiN), and the metal layer 45 may be formed of copper. The metal layer 45 is formed in a manner such that a Cu seed layer 42 is formed on the barrier metal layer 40 by a sputtering method and then a plating method is carried out thereon using the Cu seed layer 42. After the metal layer 45 is formed, heat treatment is carried out for enhancing the electrical characteristics of the metal layer 45. However, heat treatment may cause the above-mentioned dissolving reaction in the low-k dielectric layer 17 due to the hydrofluoric acid (HF) to proceed even further, thereby causing even larger voids A2 to be formed in the low-k dielectric layer 17.

Referring to FIG. 1G, the metal layer 45, the Cu seed layer 42, and the barrier metal layer 40 are planarized to form an upper interconnection which fills the trench region 35 and the final via hole 25a. The mask pattern 23 may be removed at the same time in the planarization process. The upper interconnection is composed of a barrier metal layer 40a, a Cu seed layer 42a, and a metal layer 45a which are planarized. The planarization process may be carried out using a chemical mechanical polishing process. It is noted, however, that, the shape of the low-k dielectric layer 17 may be deformed by the voids A2 during the chemical mechanical polishing process. Consequently, a short circuit may occur in an undesired region between metal interconnections, and thus subsequent processes may encounter difficulties due to the above-mentioned deformation.

Accordingly, there is a need for a method for preventing voids from forming within a low-k dielectric layer, during the dry-etching stage or stages of fabricating this layer.

SUMMARY OF THE INVENTION

In an exemplary embodiment of the present invention a method of fabricating a semiconductor device is provided. This method includes forming a low-k dielectric layer on a semiconductor substrate. A mask pattern is formed on the low-k dielectric layer. The low-k dielectric layer is dry etched using the mask pattern as an etch mask. In this case, a dry etching gas for dry etching the low-k dielectric layer, includes a mixture of a gas containing chlorine atoms and at least one gas selected from a group consisting of a gas containing oxygen atoms, a gas containing nitrogen atoms, and an inert gas. Moreover, the dry-etching gas does not contain fluorine atoms.

In another exemplary embodiment of, the present invention, a method of fabricating a semiconductor device is provided. The method includes forming a lower interconnection on a semiconductor substrate. An etch stop layer, a low-k dielectric layer, and a capping layer are formed on the semiconductor substrate having the lower interconnection. A mask pattern is formed on the capping layer. Primary dry etching is carried out on the capping layer and the low-k dielectric layer using the mask pattern as an etch mask, thereby forming a preliminary via hole exposing the etch stop layer above the lower interconnection. In this case, a primary dry etching gas is used for carrying out the primary dry etching. The primary dry etching gas includes a mixture of a gas containing chlorine atoms and at least one gas selected from a group consisting of a gas containing oxygen atoms, a gas containing nitrogen atoms, and an inert gas. A sacrificial layer is formed which buries the preliminary via hole on the semiconductor substrate having the preliminary via hole. A photoresist pattern is formed on the sacrificial layer. Secondary dry etching is carried out on the sacrificial layer, the mask pattern, the capping layer, and the low-k dielectric layer using the photoresist pattern as an etch mask, thereby forming a trench region crossing over the preliminary via hole and which is positioned within the low-k dielectric layer. A secondary dry etching gas is used to carry out the secondary dry etching. In this case, the primary etching gas used for the primary dry etching is substantially the same as the gas used for the secondary dry etching. The photoresist pattern and the sacrificial layer are removed to expose the etch stop layer on a bottom surface of the preliminary via hole. The exposed etch stop layer is etched to form a final via hole which exposes the lower interconnection. Further, the primary and secondary etching gases do not contain fluorine atoms.

DETAILED DESCRIPTION OF THE EXEMPLARY EMBODIMENTS OF THE INVENTION

Figure 1A:
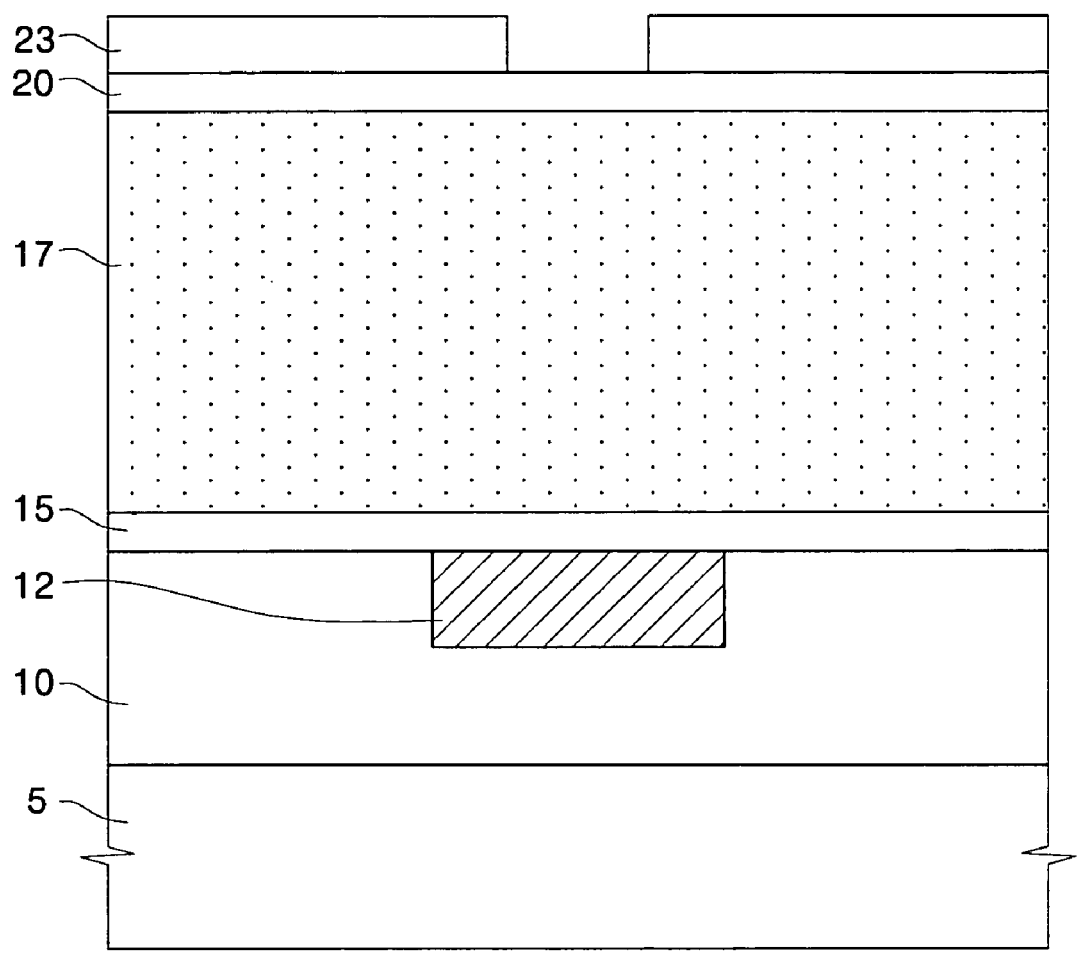
FIGS. 1A to 1G are cross-sectional views illustrating a conventional method of fabricating a semiconductor device having a low-k dielectric layer.
Figure 1B:
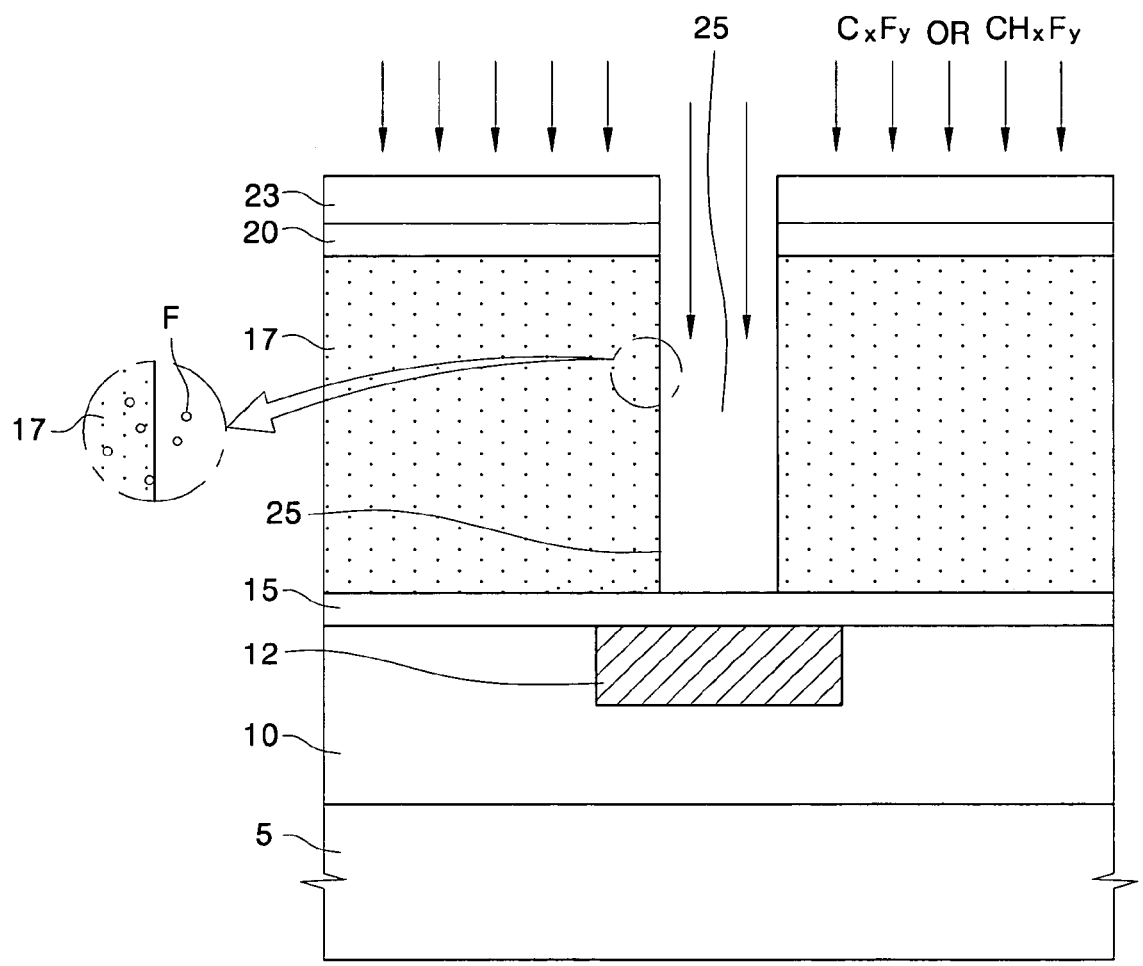
Figure 1C:
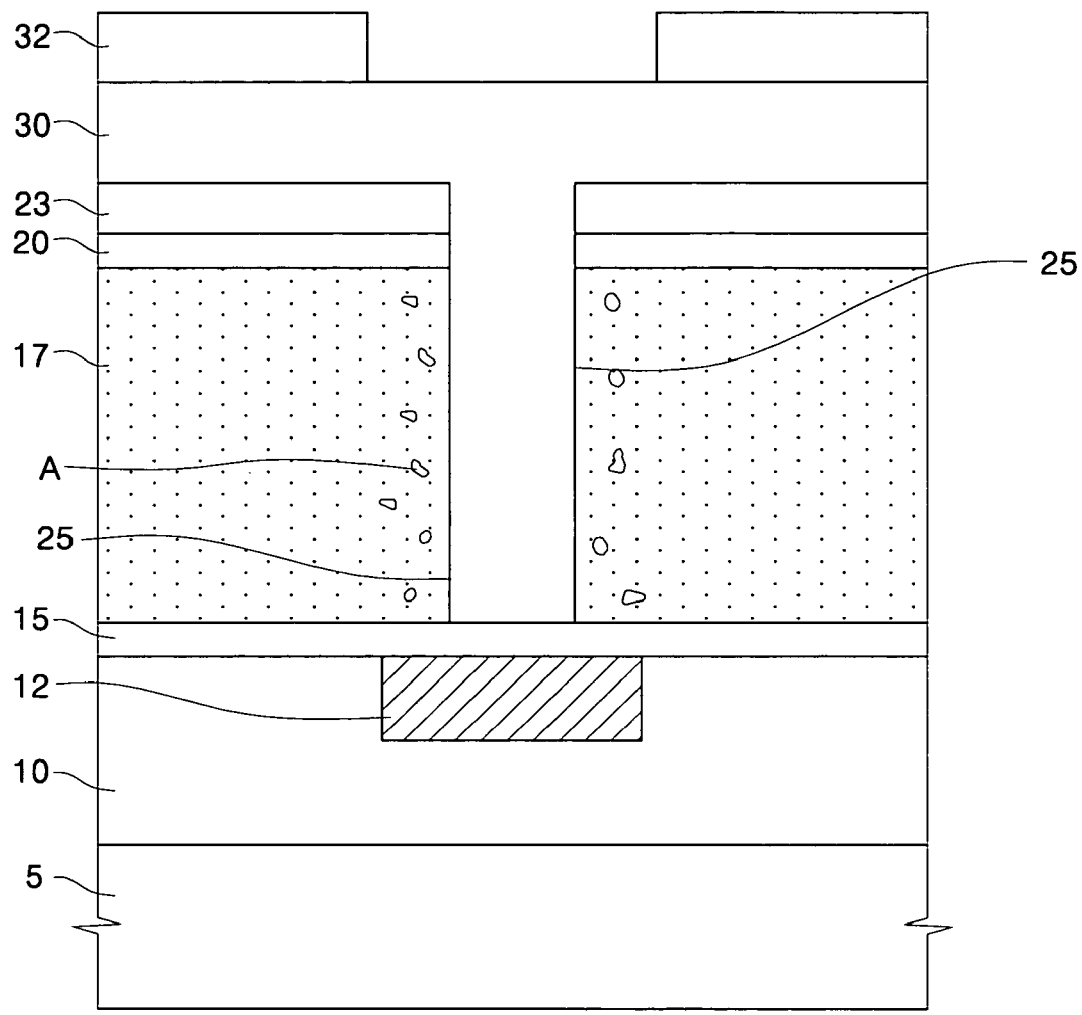
Figure 1D:
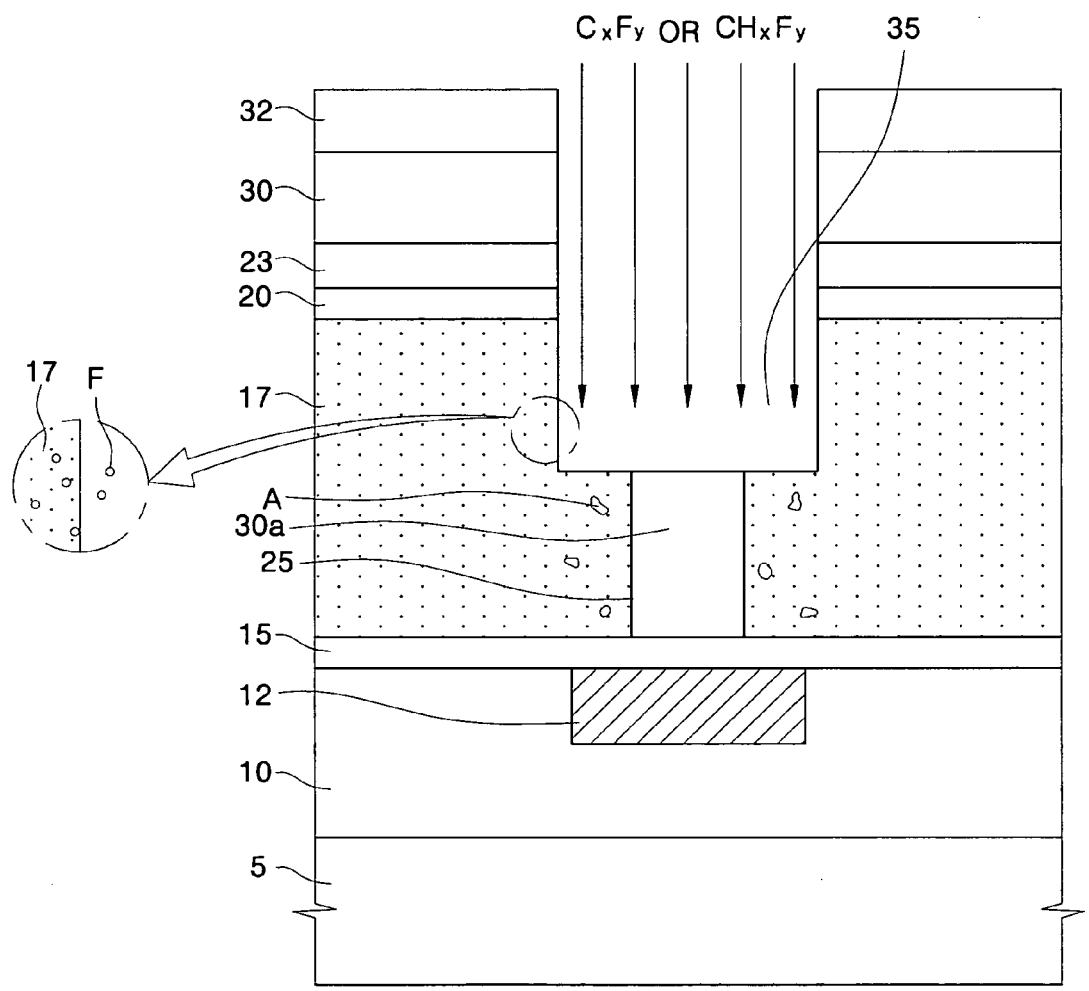
Figure 1E:
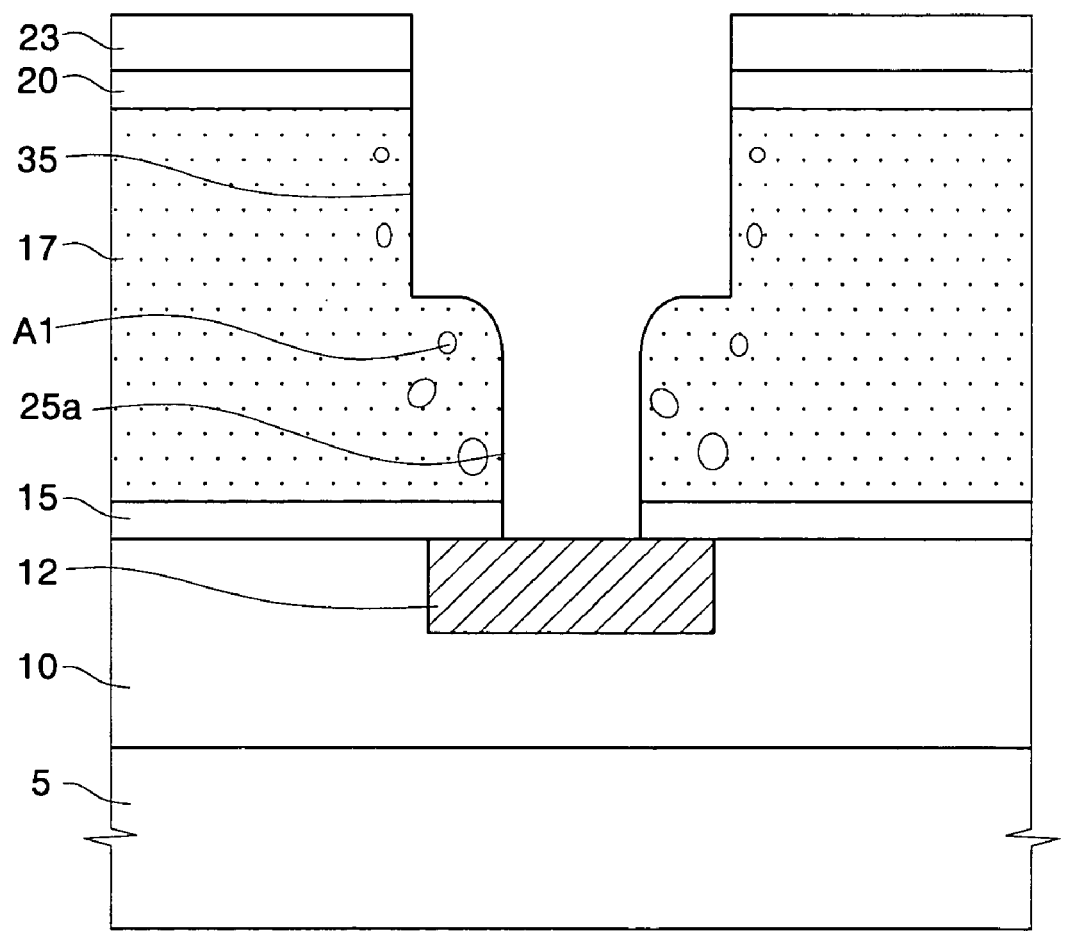
Figure 1F:
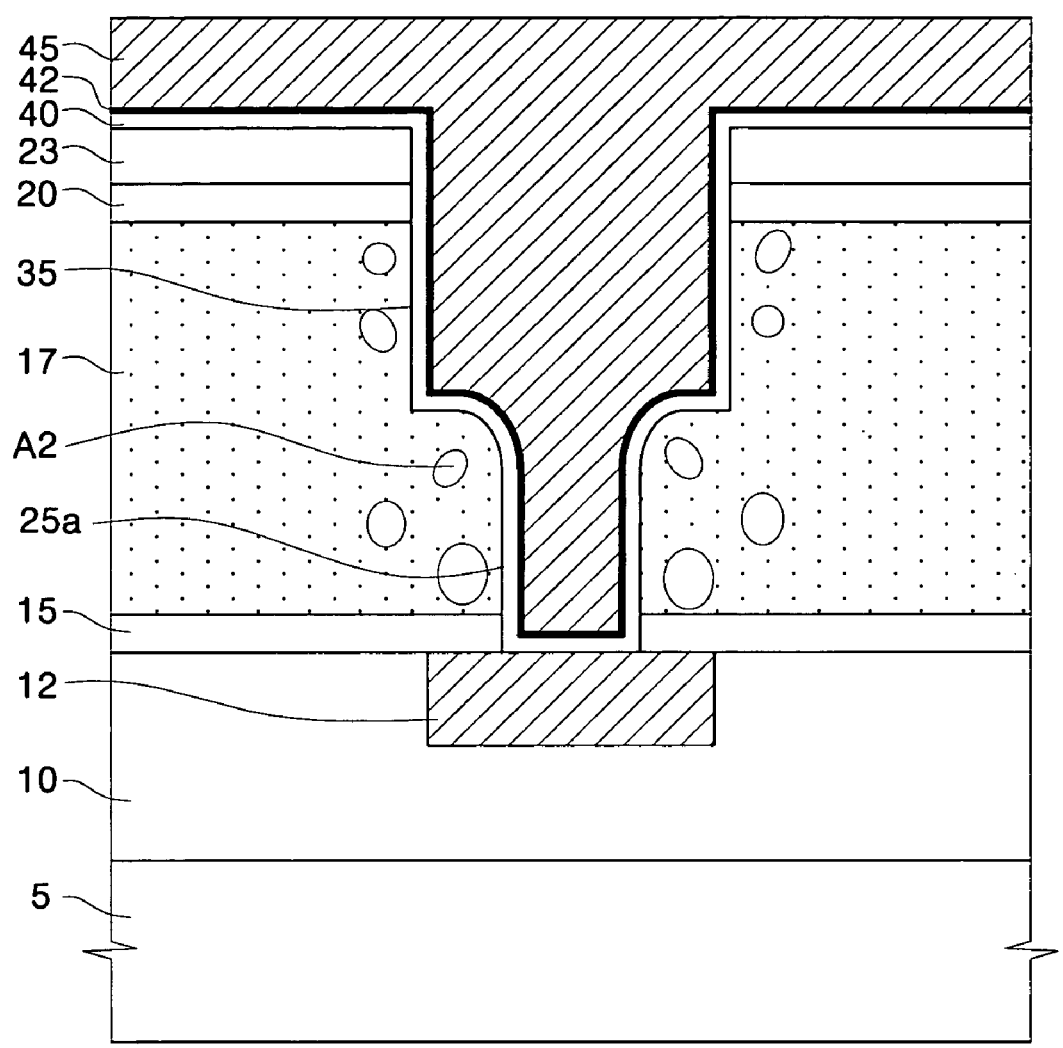
Figure 1G:
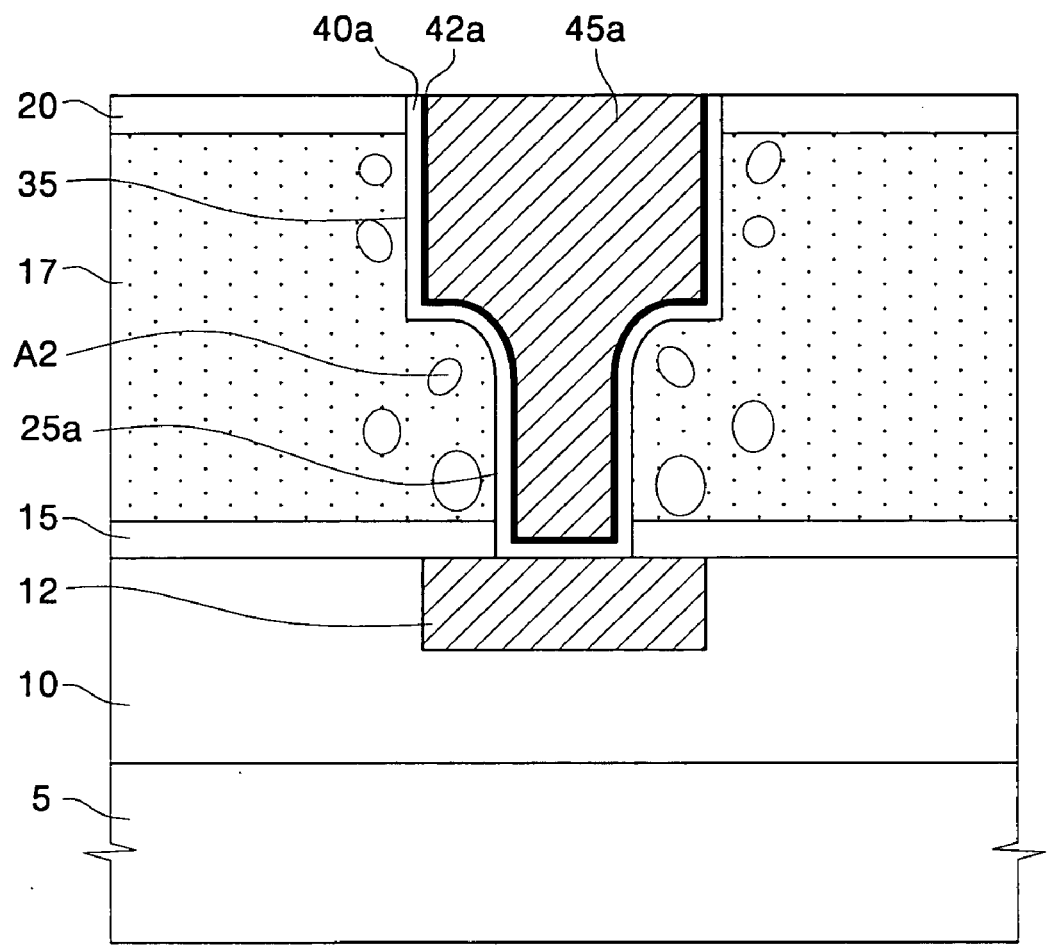

The exemplary embodiments of the present invention will now be described more fully hereinafter with reference to the accompanying drawings, in which exemplary embodiments of the invention are shown. In the drawings, the thickness of the layers and regions are exaggerated for clarity.

Figure 2:
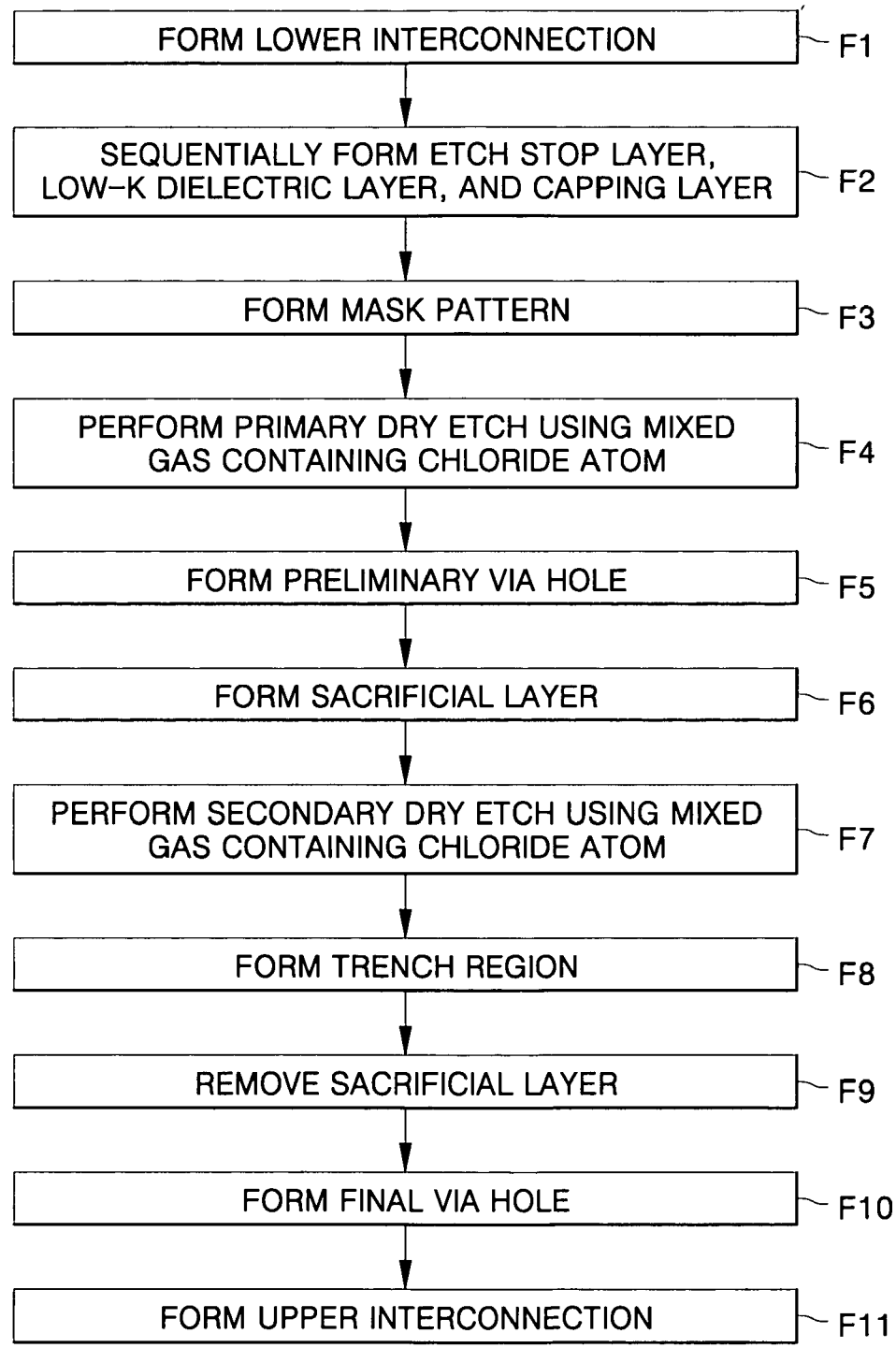
FIG. 2 is a process flow chart illustrating a method of fabricating a semiconductor device having a low-k dielectric layer in accordance with an exemplary embodiment of the present invention.

FIG. 2 is a process flow chart illustrating a method of fabricating a semiconductor device having a low-k dielectric layer in accordance with an exemplary embodiment of the present invention, and FIG. 3A to 3G are cross-sectional views illustrating a method of fabricating a semiconductor device having a low-k dielectric layer in accordance with an exemplary embodiment of the present invention.

Figure 3A:
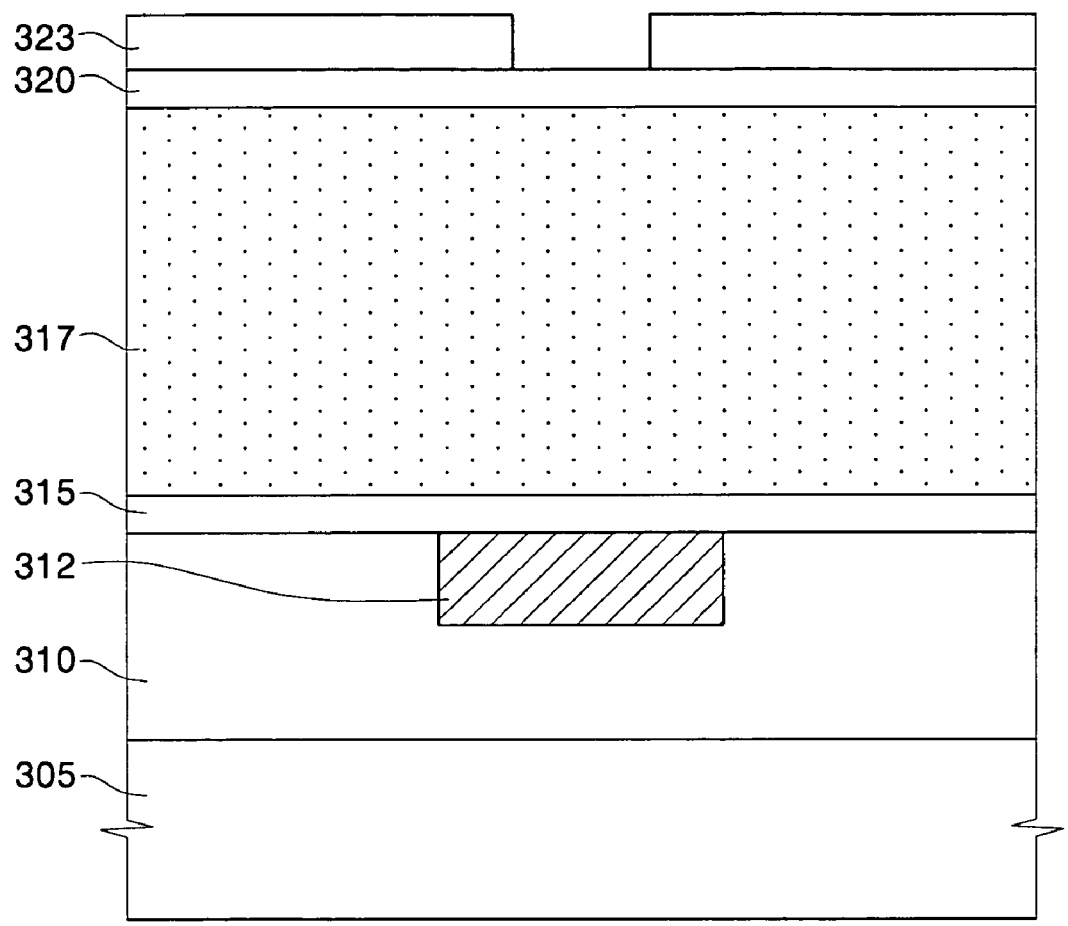
FIG. 3A to 3G are cross-sectional views illustrating a method of fabricating a semiconductor device having a low-k dielectric layer in accordance with an exemplary embodiment of the present invention.

Referring to FIGS. 2 and 3A, a lower insulating layer 310 is formed on a semiconductor substrate 305. A lower interconnection 312 is formed within the lower insulating layer 310 using a typical damascene technique (step F1 in FIG. 2). The lower interconnection 312 is formed of a copper (Cu) or tungsten (W) layer.

An etch stop layer 315, a low-k dielectric layer 317, and a capping layer 320 are sequentially formed on the semiconductor substrate having the lower interconnection 312 (step F2 in FIG. 2). The etch stop layer 315 is preferably formed of an insulating nitride layer or an insulating carbide layer which has an etch selectivity with respect to the low-k dielectric layer 317. The insulating nitride layer is formed of a silicon nitride layer (SiN), a silicon carbonitride layer (SiCN), or a boron nitride layer (BN), and the insulating carbide layer is formed of a silicon carbide layer (SiC).

The low-k dielectric layer 317 is preferably formed of a single low-k dielectric layer for enhancing the operating speed of the semiconductor device and also to prevent the formation of an interface within the low-k dielectric layer 317. The single low-k dielectric layer is formed of a silicon oxide layer containing carbon (C), fluorine (F), or hydrogen (H), for example, a silicon oxycarbide (SiOC) layer, a carbon-doped silicon oxide (SiOCH) layer, or a silicon oxyfluoride (SiOF) layer. In addition, the low-k dielectric layer 317 has a porous sponge structure and may be degraded due to damage in subsequent processes. Accordingly, the capping layer 320 is formed to protect the characteristics of the low-k dielectric layer 317.

The capping layer 320 is preferably formed of an insulating oxide layer, an insulating nitride layer, an insulating carbide layer, a metal nitride layer, or a metal oxide layer which has an etch selectivity with respect to the low-k dielectric layer 317. The insulating oxide layer is formed of a silicon oxide ($SiO_2$) layer, a tetra ethyl ortho silicate (TEOS) layer, or a low temperature oxide (LTO) layer, and the insulating nitride layer is formed of a silicon nitride (SiN) layer, a silicon carbonitride (SiCN) layer, or a boron nitride (BN) layer. The insulating carbide layer is formed of a silicon carbide (SiC) layer. The metal nitride layer is formed of a tantalum nitride layer or a titanium nitride layer, and the metal oxide layer is formed of an aluminum oxide ($Al_2O_3$) layer, a tantalum oxide layer, or a titanium oxide layer.

Additionally, a mask layer is formed on the capping layer 320. The mask layer is patterned to form a mask pattern 323 (step F3 in FIG. 2). The mask pattern 323 is formed of a photoresist pattern or a hard mask pattern. The hard mask pattern is preferably formed of a material layer having a high etch selectivity with respect to the low-k dielectric layer. The hard mask pattern is formed of silicon carbide (SiC) or silicon nitride (SiN).

Figure 3B:
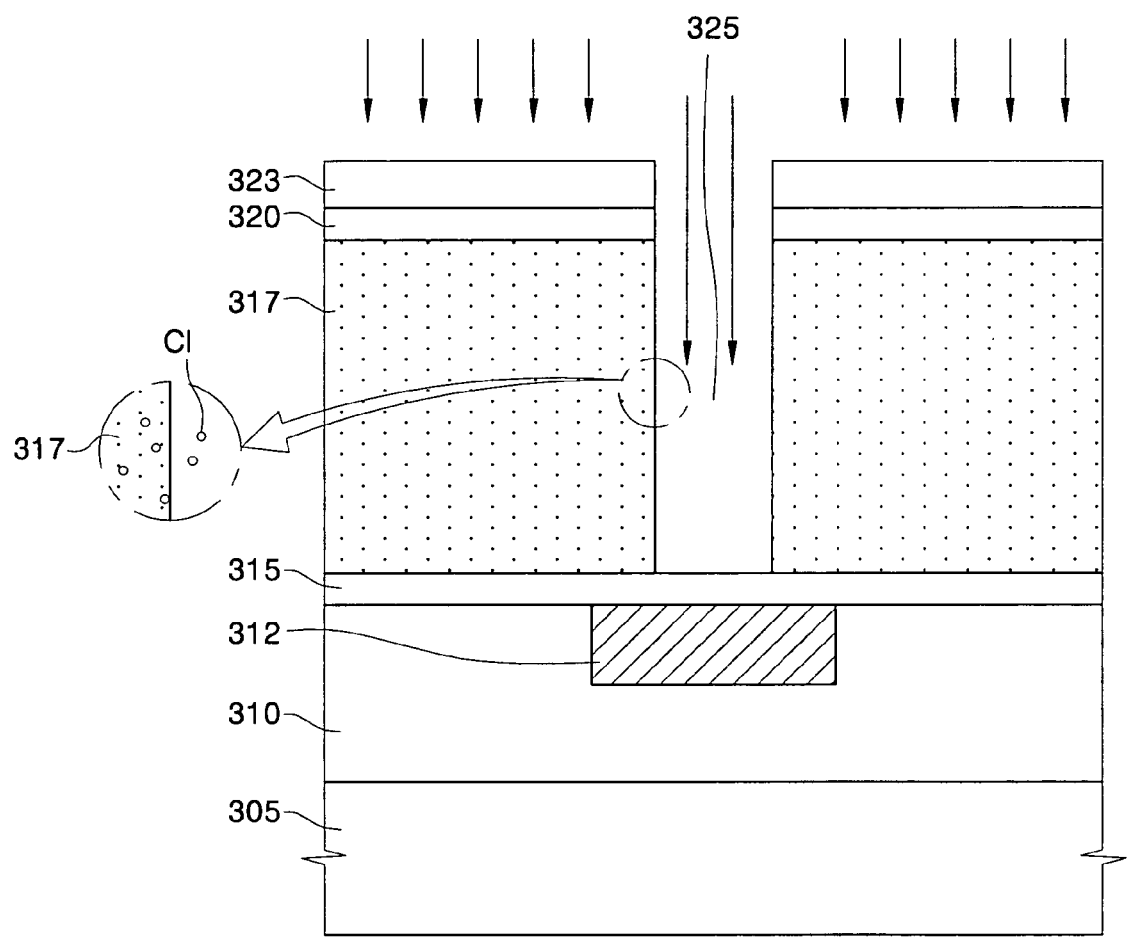

Referring to FIGS. 2 and 3B, primary dry etching is sequentially carried out on the capping layer 320 and the low-k dielectric layer 317 using the mask pattern 323 as an etch mask (step F4 in FIG. 2). As a result, a preliminary via hole 325 is formed which exposes the etch stop layer 315 above the lower interconnection 312 (step F5 in FIG. 2). In this case, a primary dry etch gas comprising a mixture of a gas containing chlorine atoms and at least one gas selected from a group consisting of a gas containing oxygen atoms, a gas containing nitrogen atoms, and an inert gas, is used as the primary dry etching gas. The gas containing the chlorine atoms is preferably at least one gas selected from a group consisting of chlorine ($Cl_2$), boron trichloride ($BCl_3$), and carbon tetrachloride ($CCl_4$). The gas containing the oxygen atoms is preferably at least one gas selected from a group consisting of oxygen ($O_2$), carbon monoxide (CO), and nitrous oxide ($N_2O$). The gas containing the nitrogen atoms is nitrogen ($N_2$) or nitrous oxide ($N_2O$) gas. The inert gas is at least one gas selected from the group consisting of helium (He), argon (Ar), and xenon (Xe).

The low-k dielectric layer 317 has a porous sponge structure, so that the chlorine atoms Cl are absorbed into the low-k dielectric layer 317 when the dry etching is carried out thereon using the gas mixed with the chlorine atoms. A chlorine-based deposit, which is formed on surfaces of the semiconductor substrate after the primary dry etching is carried out, is removed using a gas containing oxygen or hydrogen. In addition, when the mask pattern 323 is formed of a photoresist pattern, the mask pattern 323 is removed after the preliminary via hole 325 is formed.

Figure 3C:
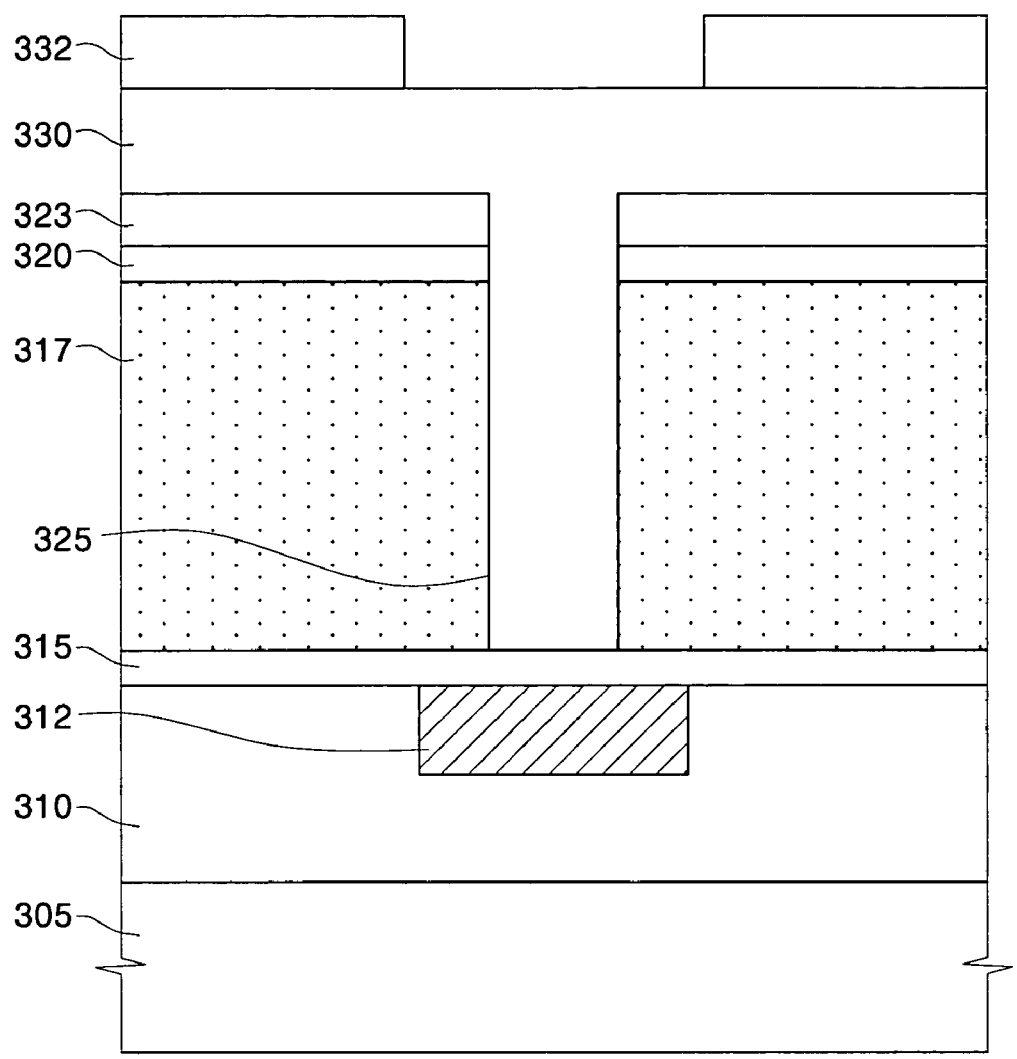

Referring to FIGS. 2 and 3C, a sacrificial layer 330, which buries the preliminary via hole 325, is formed on the semiconductor substrate having the preliminary via hole 325 (step F6 in FIG. 2). A photoresist pattern 332 is formed on the sacrificial layer 330. The sacrificial layer 330 is formed for preventing deformation of the profile of the preliminary via hole 325 in subsequent processes. The sacrificial layer 330 is formed of a layer having a wet etching selectivity with respect to the low-k dielectric layer 317. The sacrificial layer 330 is formed of a hydro-silsesquioxane (HSQ) layer or an organic siloxane. Hydrogen or moisture ($H_2O$) is absorbed into the low-k dielectric layer 317 while the sacrificial layer 330 is formed. Consequently, hydrogen or moisture reacts with the chlorine atoms (Cl) which have already been absorbed within the low-k dielectric layer 317, thereby forming hydrochloric acid (HCl). However, the HCl does not react with the low-k dielectric layer 317, so that it does not cause damage to the low-k dielectric layer 317.

Figure 3D:
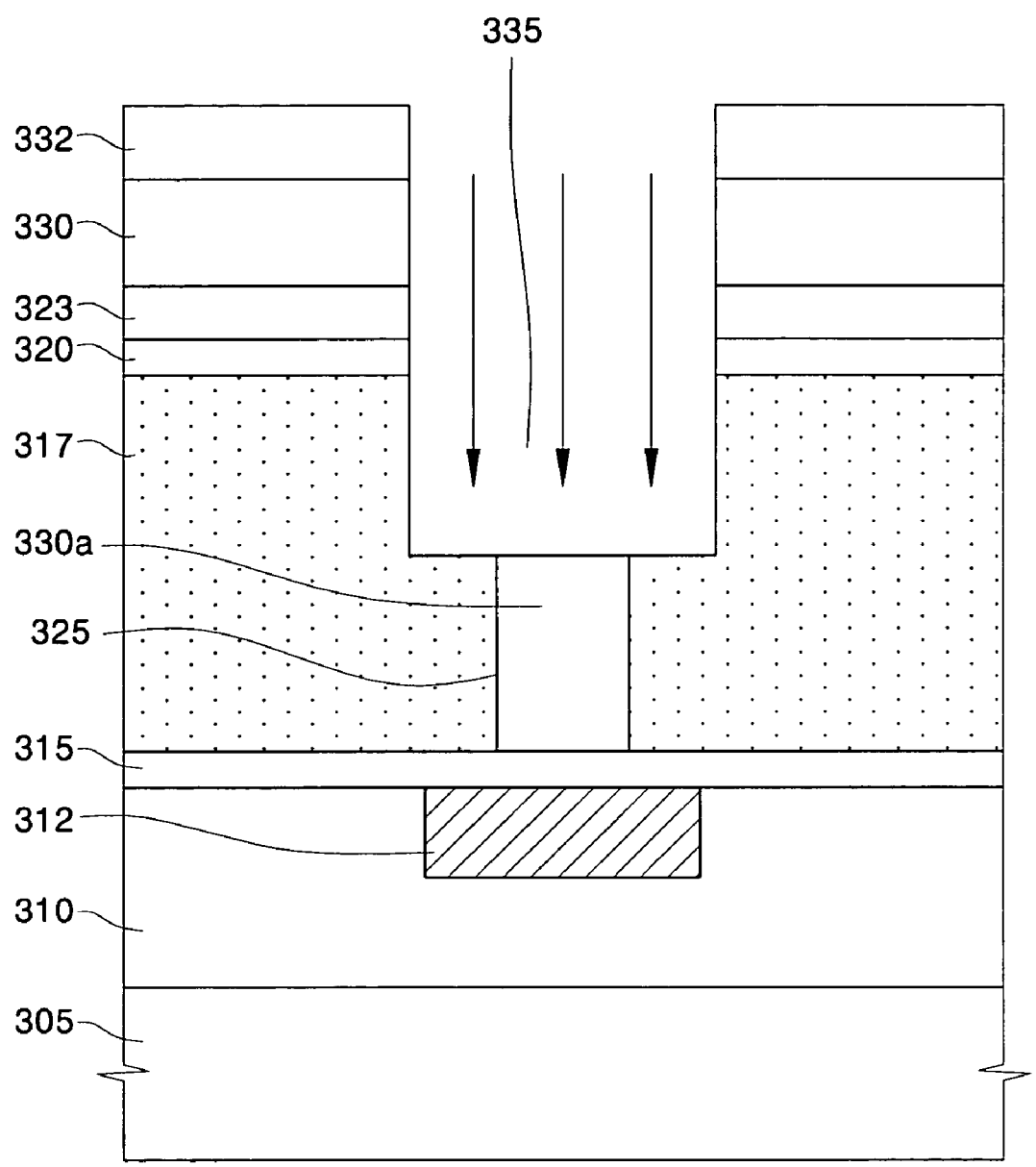

Referring to FIGS. 2 and 3D, secondary dry etching is then sequentially carried out on the sacrificial layer 330, the mask pattern 323, the capping layer 320, and the low-k dielectric layer 317 using the photoresist pattern 332 as an etch mask (step F7 in FIG. 2), thereby forming a trench region 335 which crosses over the preliminary via hole 325 and which is positioned within the low-k dielectric layer 317 (step F8 in FIG. 2). In addition, a sacrificial layer 330a remains within the preliminary via hole 325.

A secondary dry etch gas comprising a mixture of a gas containing chlorine atoms and at least one gas selected from a group consisting of a gas containing oxygen atoms, a gas containing nitrogen atoms, and an inert gas, is used as the secondary dry etching gas. The gas containing the chlorine atoms is preferably at least one gas selected from a group consisting of chlorine ($Cl_2$), boron trichloride ($BCl_3$), and carbon tetrachloride ($CCl_4$). The gas containing the oxygen atoms is preferably at least one gas selected from a group consisting of oxygen ($O_2$), carbon monoxide (CO), and nitrous oxide ($N_2O$). The gas containing the nitrogen atoms is nitrogen ($N_2$) or nitrous oxide ($N_2O$) gas. The inert gas is at least one gas selected from a group consisting of helium (He), argon (Ar), and xenon (Xe).

The low-k dielectric layer 317 has a porous sponge structure, so that the chlorine atoms (Cl) are absorbed into the low-k dielectric layer 317 through a sidewall of the trench region 335 as in the primary dry etching process when the dry etching is carried out thereon using the gas mixed with the chlorine atoms. A chlorine-based deposit, which is formed on surfaces of the semiconductor substrate after the secondary dry etching is carried out, is removed using a gas containing oxygen or hydrogen.

Figure 3E:
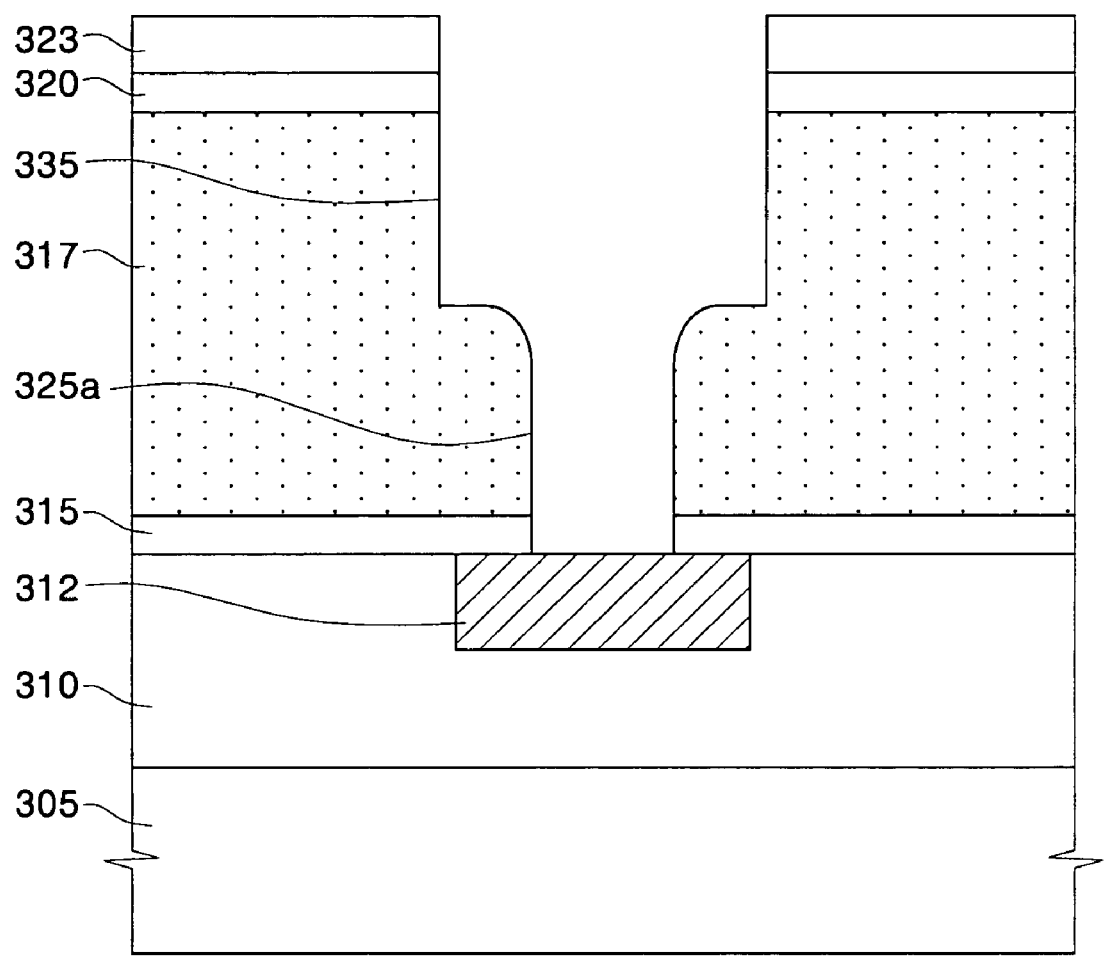

Referring to FIGS. 2 and 3E, the sacrificial layer 330a within the preliminary via hole 325 and the sacrificial layer 330 above the low-k dielectric layer 317 are removed (step F9 in FIG. 2). The sacrificial layers 330 and 330a are removed using a wet solution, thereby exposing the etch stop layer 315 on a bottom surface of the preliminary via hole 325. The sacrificial layer 330a has a wet etch selectivity with respect to the low-k dielectric layer 317, so that a surface of the low-k dielectric layer 317 is prevented from being damaged due to the etching.

The etch stop layer 315 exposed on the bottom surface of the preliminary via hole 325 is removed to form a final via hole 325a, thereby exposing the lower interconnection 312 (step F10 in FIG. 2). The etch stop layer 315 is removed by a dry etching process. A portion of the mask pattern 323 is etched while the etch stop layer 315 is being etched.

Figure 3F:
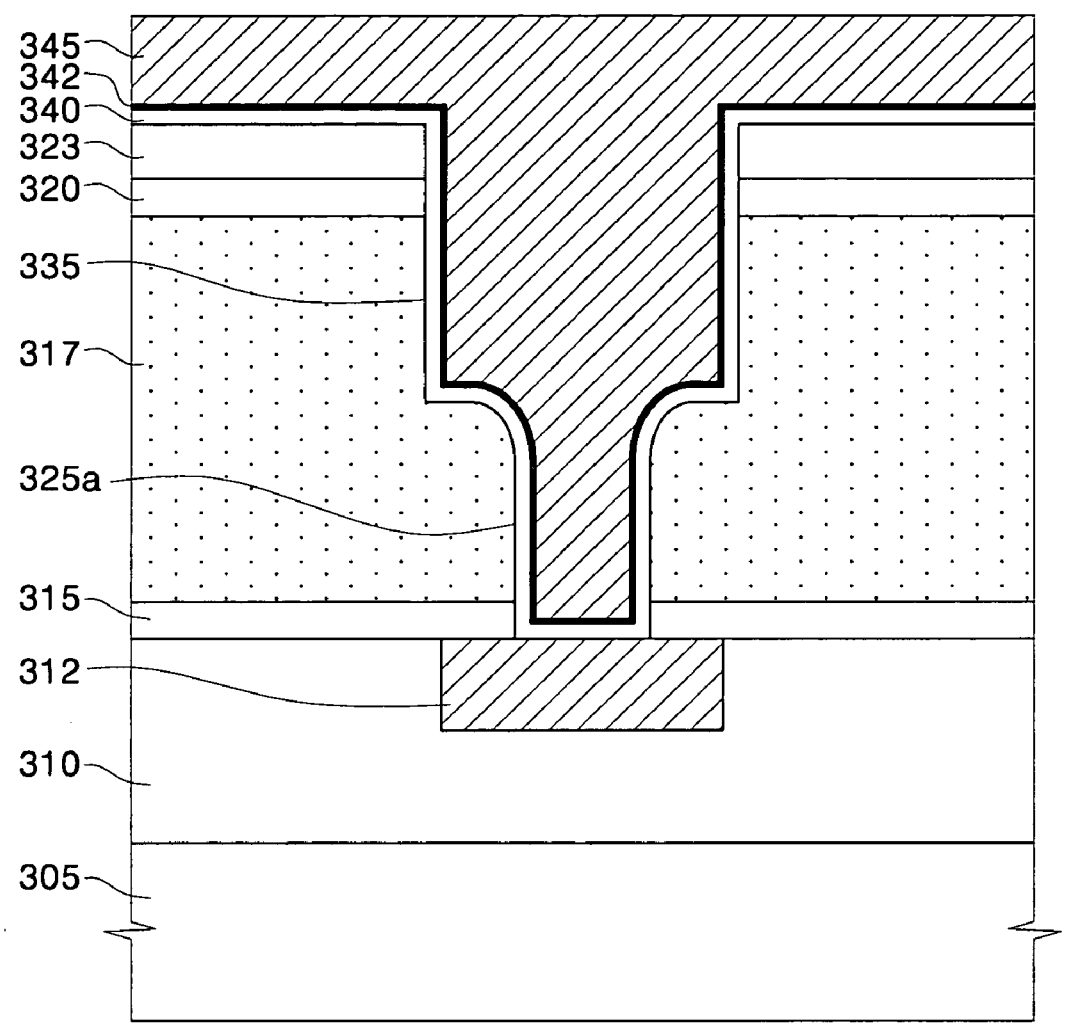

Referring to FIGS. 2 and 3F, an upper metal layer is formed on the semiconductor substrate having the final via hole 325a. The upper metal layer is formed by sequentially stacking a barrier metal layer 340 and a metal layer 345. The barrier metal layer 340 is formed of tantalum nitride (TaN) or titanium nitride (TiN), and the metal layer 345 is formed of copper (Cu). The metal layer 345 is formed in a manner such that a copper (Cu) seed layer 342 is formed on the barrier metal layer 340 using a sputtering method and then a plating method is carried out thereon using the Cu seed layer 342. After the metal layer 345 is formed, heat treatment is carried out for enhancing the electrical characteristics of the metal layer 345. The HCl formed within the low-k dielectric layer 317 does not react with the low-k dielectric layer 317 even when the heat treatment is carried out, so that the low-k dielectric layer 317 is not dissolved but rather remains as is.

Figure 3G:
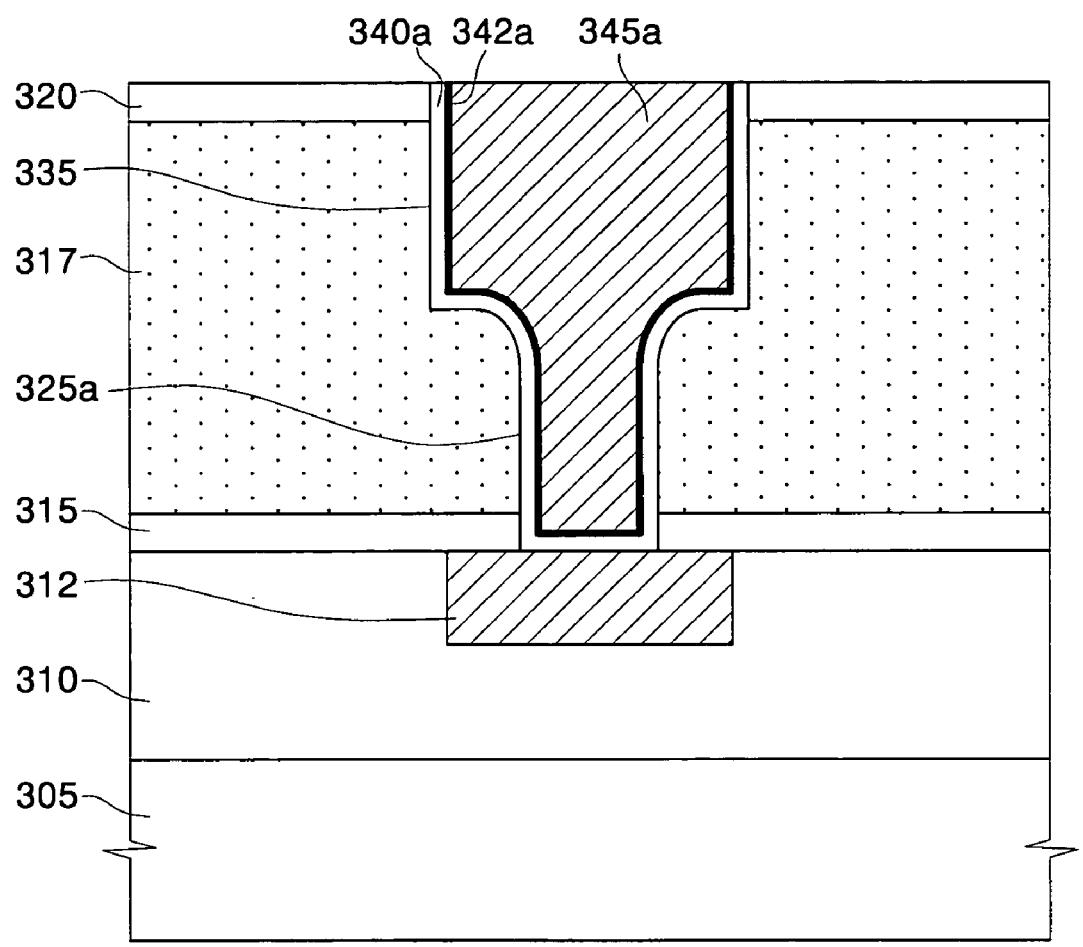

Referring to FIGS. 2 and 3G, the metal layer 345, the Cu seed layer 342, and the barrier metal layer 340 are planarized to form an upper interconnection which fills the trench region 335 and the final via hole 325a (step F11 in FIG. 2). The mask pattern 323 is removed at the same time in the planarization process. The upper interconnection is composed of a barrier metal layer 340a, a Cu seed layer 342a, and a metal layer 345a which are planarized. The planarization process is carried out using a chemical mechanical polishing process.

According to the exemplary embodiments of the present invention as described above, when dry-etching a low-k dielectric layer having a porous sponge structure, instead of the conventional way which involves using a gas containing fluorine atoms as the etch gas, a dry etch gas comprising a mixture of a gas containing chlorine atoms and at least one gas selected from a group consisting of a gas containing oxygen atoms, a gas containing nitrogen atoms, and an inert gas, is used as the dry etching gas. Consequently, the methods of the exemplary embodiments of the present invention prevent void defects from forming within a low-k dielectric layer, which result from dissolved hydrofluoric acid being generated within the low-k dielectric layer due to absorption of fluorine atoms within the low-k dielectric layer when it is dry etched using a conventional dry etching gas containing fluorine atoms. Accordingly, a low-k dielectric layer prepared in accordance with the exemplary embodiments of the present invention can be stably applied to a highly integrated semiconductor device and a semiconductor device for high speed operation.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of fabricating a semiconductor device, comprising:

forming a low-k dielectric layer on a semiconductor substrate;

forming a mask pattern on the low-k dielectric layer;

dry etching the low-k dielectric layer using the mask pattern as an etch mask, wherein a dry etching gas is used for the dry etching of the low-k dielectric layer, the dry etching gas comprises a mixture of a gas containing chlorine atoms and at least one gas selected from a group consisting of a gas containing oxygen atoms, a gas containing nitrogen atoms, and an inert gas, and wherein said dry etching gas does not contain fluorine atoms; and removing a chlorine-based deposit which is formed on the semiconductor substrate after the dry etching of the low-k dielectric layer is carried out using a gas selected from a group consisting of a gas containing oxygen and a gas containing hydrogen.

2. The method according to claim 1, wherein the low-k dielectric layer is formed of one layer selected from a group consisting of a silicon oxycarbide (SiOC) layer, a carbon-doped silicon oxide (SiOCH) layer, and a silicon oxyfluoride (SiOF) layer.

3. The method according to claim 1, wherein the gas containing the chlorine atoms is at least one gas selected from a group consisting of chlorine ($Cl_2$), boron trichloride ($BCl_3$), and carbon tetrachloride ($CCl_4$).

4. The method according to claim 1, wherein the gas containing the oxygen atoms is at least one gas selected from a group consisting of oxygen ($O_2$), carbon monoxide (CO), and nitrous oxide ($N_2O$).

5. The method according to claim 1, wherein the gas containing the nitrogen atoms is at least one gas selected from a group consisting of nitrogen ($N_2$) gas and nitrous oxide ($N_2O$) gas.

6. The method according to claim 1, wherein the inert gas is at least one gas selected from a group consisting of helium (He), argon (Ar), and xenon (Xe).

7. A method of fabricating a semiconductor device, comprising:

forming a lower interconnection on a semiconductor substrate;

forming an etch stop layer, a low-k dielectric layer, and a capping layer on the semiconductor substrate having the lower interconnection;

forming a mask pattern on the capping layer;

carrying out primary dry etching on the capping layer and the low-k dielectric layer using the mask pattern as an etch mask to form a preliminary via hole exposing the etch stop layer above the lower interconnection, wherein a primary dry etching gas is used for carrying out the primary drying etching, said primary dry etching gas comprises a gas containing chlorine atoms and at least one gas selected from a group consisting of a gas containing oxygen atoms, a gas containing nitrogen atoms, and an inert gas;

removing a chlorine-based deposit which is formed on the semiconductor substrate after the primary dry etching on the capping layer and the low-k dielectric layer is carried out using a gas selected from a group consisting of a gas containing oxygen and a gas containing hydrogen;

forming a sacrificial layer which buries the preliminary via hole on the semiconductor substrate having the preliminary via hole;

forming a photoresist pattern on the sacrificial layer;

carrying out secondary dry etching on the sacrificial layer, the mask pattern, the capping layer, and the low-k dielectric layer using the photoresist pattern as an etch mask to form a trench region crossing over the preliminary via hole and positioned within the low-k dielectric layer, wherein a secondary dry etching gas is used for the secondary dry etching, the secondary dry etching gas being substantially the same as the primary dry etching gas used for the primary dry etching;

removing a chlorine-based deposit which is formed on the semiconductor substrate after the secondary dry etching on the sacrificial layer, the mask pattern, the capping layer and the low-k dielectric layer is carried out using a gas selected from a group consisting of a gas containing oxygen and a gas containing hydrogen;

removing the photoresist pattern and the sacrificial layer to expose the etch stop layer on a bottom surface of the preliminary via hole; and etching the exposed etch stop layer to form a final via hole exposing the lower interconnection, and wherein the primary and secondary dry etching gases do not contain fluorine atoms.

8. The method according to claim 7, wherein the low-k dielectric layer is formed of one layer selected from a group consisting of a silicon oxycarbide (SiOC) layer, a carbon-doped silicon oxide (SiOCH) layer, and a silicon oxyfluoride (SiOF) layer.

9. The method according to claim 7, wherein the gas containing the chlorine atoms is at least one gas selected from a group consisting of chlorine ($Cl_2$), boron trichloride ($BCl_3$), and carbon tetrachloride ($CCl_4$).

10. The method according to claim 7, wherein the gas containing the oxygen atoms is at least one gas selected from a group consisting of oxygen ($O_2$), carbon monoxide (CO), and nitrous oxide ($N_2O$).

11. The method according to claim 7, wherein the gas containing the nitrogen atoms is at least one gas selected from a group consisting of nitrogen ($N_2$) gas and nitrous oxide ($N_2O$) gas.

12. The method according to claim 7, wherein the inert gas is at least one gas selected from a group consisting of helium (He), argon (Ar), and xenon (Xe).

13. The method according to claim 7, wherein the etch stop layer has an etch selectivity with respect to the low-k dielectric layer, the etch stop layer is formed of a layer selected from a group consisting of an insulating nitride layer and an insulating carbide layer.

14. The method according to claim 13, wherein the insulating nitride layer is a layer selected from a group consisting of a silicon nitride (SiN) layer, a silicon carbonitride (SiCN) layer, and a boron nitride (BN) layer, and wherein the insulating carbide layer is formed of a silicon carbide (SiC) layer.

15. The method according to claim 7, wherein the capping layer has an etch selectivity with respect to the low-k dielectric layer and the sacrificial layer, the capping layer is formed of a layer selected from a group consisting of an insulating oxide layer, an insulating nitride layer, an insulating carbide layer, a metal nitride layer, and a metal oxide layer.

16. The method according to claim 15,
wherein the insulating oxide layer is formed of a layer selected from a group consisting of a silicon oxide ($SiO_2$) layer, a tetra ethyl ortho silicate (TEOS) layer, and a low temperature oxide (LTO) layer, wherein the insulating nitride layer is formed a layer selected from a group consisting of a silicon nitride (SiN) layer, a silicon carbonitride (SiCN) layer, and a boron nitride (BN) layer, wherein the insulating carbide layer is formed of a silicon carbide (SiC) layer, wherein the metal nitride layer is formed of a layer selected from a group consisting of a tantalum nitride layer and a titanium nitride layer, and wherein the metal oxide layer is formed of a layer selected from a group consisting of an aluminum oxide ($Al_2O_3$) layer, a tantalum oxide layer, and a titanium oxide layer.

17. The method according to claim 7, wherein the mask pattern is formed of a pattern selected from a group consisting of a photoresist pattern and a hard mask pattern.

18. The method according to claim 17, wherein the hard mask pattern is formed of a material layer having a high etch selectivity with respect to the low-k dielectric layer.

19. The method according to claim 18, wherein the hard mask pattern is formed of a material selected from a group consisting of silicon carbide (SiC) and silicon nitride (SiN).

20. The method according to claim 7, wherein the sacrificial layer is formed of a layer selected from a group consisting of hydro-silsesquioxane (HSQ) layer and organic siloxane.

21. The method according to claim 7, further comprising:
after forming the final via hole, forming an upper metal layer which fills the final via hole and the trench region on the semiconductor substrate having the final via hole; and planarizing the upper metal layer to form an upper metal interconnection which fills the final via hole and the trench region.

22. The method according to claim 21, wherein the upper metal layer is formed by stacking a barrier metal layer and a metal layer.

23. The method of claim 7, wherein the chlorine-based deposits which are formed on the semiconductor substrate after the primary dry etching and the secondary dry etching are carried out are removed using a gas containing oxygen.

* * * * *